United States Patent
Willis

(10) Patent No.: US 9,414,490 B2
(45) Date of Patent: Aug. 9, 2016

(54) ELECTRICAL CIRCUIT BOARD TRACE PATTERN TO MINIMIZE CAPACITOR CRACKING AND IMPROVE RELIABILITY

(71) Applicant: HIQ SOLAR, INC., Santa Clara, CA (US)

(72) Inventor: Andre P. Willis, Palo Alto, CA (US)

(73) Assignee: HIQ SOLAR, INC., Santa Clara, CA (US)

( * ) Notice: Subject to any disclaimer, the term of this patent is extended or adjusted under 35 U.S.C. 154(b) by 0 days.

(21) Appl. No.: 14/206,750

(22) Filed: Mar. 12, 2014

(65) Prior Publication Data

US 2014/0311791 A1    Oct. 23, 2014

Related U.S. Application Data

(60) Provisional application No. 61/782,479, filed on Mar. 14, 2013.

(51) Int. Cl.
*H05K 7/10* (2006.01)
*H05K 1/11* (2006.01)
*H05K 3/34* (2006.01)

(52) U.S. Cl.
CPC .............. *H05K 1/111* (2013.01); *H05K 3/3442* (2013.01); *H05K 2201/10015* (2013.01); *Y02P 70/611* (2015.11)

(58) Field of Classification Search
CPC .......... H05K 2201/10734; H05K 2201/10636; H05K 2201/068; H05K 3/10; H05K 13/0486; H01K 1/111; H01K 1/141; H01K 1/0231; H01K 1/0221; H01L 2224/16; H01L 23/4927
USPC .............................. 361/767–768, 782; 29/829
See application file for complete search history.

(56) References Cited

U.S. PATENT DOCUMENTS

| | | | |
|---|---|---|---|
| 7,872,874 B2 * | 1/2011 | Karasawa et al. | 361/767 |
| 7,976,184 B2 * | 7/2011 | Messina et al. | 362/235 |
| 8,624,436 B2 | 1/2014 | Willis | |
| 2005/0056675 A1 * | 3/2005 | Bartolone et al. | 225/2 |
| 2005/0082686 A1 * | 4/2005 | Liu | 257/780 |

FOREIGN PATENT DOCUMENTS

| | | |
|---|---|---|
| JP | 2009-331146 A | 12/1997 |
| JP | 2000-340446 A | 12/2000 |
| JP | 2002-353604 A | 12/2002 |
| JP | 2006-032511 A | 2/2006 |
| JP | 2008-103547 A | 5/2008 |

OTHER PUBLICATIONS

Company Information Manual; Wright Capacitors, Inc. (Santa Ana, CA); pp. 1-19.
Davis, et al; TDK Components USA, Inc.; Frequently asked questions regarding Common Cracking Modes in Surface Mount Multilayer Ceramic Capacitors; pp. 1-5; Apr. 2000.
Flexicap Polymer Termination; pp. 11 and 15.
Vishay Vitramon; Surface Mount Multilayer Ceramic Chip Capacitor Solutions for Boardflex Sensitive Applications; Document No. 45198; pp. 1-17.
TDK Multilayer Ceramic Chip Capacitors; C Series Mid Voltage Application; pp. 76-104; Apr. 2011.
TDK Multilayer Ceramic Chip Capacitors; C Series Open Mode Design; pp. 180-194; Apr. 2011.
International Search Report and Written Opinion in PCT/US2014/026193 is issued on Sep. 5, 2014, 10 pages.

* cited by examiner

*Primary Examiner* — Hoa C Nguyen
(74) *Attorney, Agent, or Firm* — Vedder Price

(57) ABSTRACT

A printed wiring board with a component connection pad, such as a solder pad, providing thermal stress compensation for a surface mount circuit component and method for making such a pad. The component connection pad includes opposed groups of multiple conductive fingers that are mutually connected at their far ends and separated at their near ends where they have surfaces for mounting a single surface mount circuit component.

8 Claims, 6 Drawing Sheets

(A) J-LEAD (B) L-LEAD (C) GULL-LEAD (D) FLEXICAP

ELECTRICAL CIRCUIT BOARD TRACE PATTERN TO MINIMIZE CAPACITOR CRACKING AND IMPROVE RELIABILITY

RELATED APPLICATIONS

This application claims priority to and the benefit of U.S. patent application Ser. No. 61/782,479, entitled "Novel Electrical Circuit Board Trace Pattern to Minimize Capacitor Cracking and Improve Reliability," which was filed on Mar. 14, 2013, the disclosure of which is incorporated herein by reference.

BACKGROUND

The present invention relates to capacitors mounted on standard printed circuit boards (PCBs), and in particular, to mounting pads for such capacitors.

Surface mounting of components has enabled cost and size reduction of circuit boards and enabled higher frequency operation on simple materials than was previously attainable. It is in widespread use in consumer, telecommunications, computing and many other industries.

While surface mount components are frequently used, a common alternative is components with leads. Two capacitor types are illustrated in FIGS. 1(A) and 1(B).

A common issue with leadless surface mount capacitors, particularly larger ones, is that they are prone to cracking. This can be because of mechanical stress, for example from thermal expansion, the underlying circuit board bending or from the cutting of one circuit board from the adjacent one during the manufacturing process. The older technology of leaded components suffers from this issue less because the metal leads retain a degree of flexibility that helps to relive mechanical stress that may occur.

The cracking of components jeopardizes reliability for several reasons. Firstly, because the component ceases to do its job in the circuit. It can be quite difficult to detect cracking in capacitors during manufacturing test. The second issue is that when they crack, depending upon design, the physical dislocation can cause the two plates of the capacitor to become electrically connected. As capacitors are often used for decoupling of power supplies, dislocation in this way can result in the power supply being shorted, and therefore melting, localized burning and board damage are all possible outcomes.

Capacitor cracking is a well-known problem, and has resulted in extensive literature and mitigation schemes. It typically places stringent limits on the amount of circuit board flexing allowable.

Solutions tend to fall into two categories—design changes to the surface mount component itself, and changes to the circuit board, either through the pad design or the solder used to attach to the pad.

Examples of component designs used to enable greater tolerance to mechanical stress are shown in FIGS. 2(A), 2(B), 2(C) and 2(D). FIGS. 2(A), 2(B) and 2(C) illustrate the use of leads to gain the advantage of greater flexibility. FIG. 2(D) illustrates use of an extra layer of soft material such as conductive epoxy (243) added to provide some mechanical decoupling between solder terminals and the body of the capacitor.

Another approach moves the overlap areas of the capacitor plates away from potential regions where cracking may occur. In itself this does not reduce the likelihood of cracking, but does reduce the chance of the capacitor shorting.

The methods described above add cost to the component, as well as frequently making the component larger.

The more solder that is used to connect a component to a circuit board, the better the mechanical and electrical connection. However, holding a surface mount component extremely rigidly increases the likelihood of cracking. For this reason, component manufacturers recommend the size of solder pad (FIG. 3, (302)) to use, and the amount of solder (FIG. 4, (402, 403, 404)).

These approaches are cheaper to implement than using specialized components, but also less effective—the degree of flexing that can be tolerated is lower.

SUMMARY

In accordance with the presently claimed invention, a printed wiring board with a component connection pad providing thermal stress compensation for a surface mount circuit component and method for making such a pad. The component connection pad includes opposed groups of multiple conductive fingers that are mutually connected at their far ends and separated at their near ends where they have surfaces for mounting a single surface mount circuit component.

In accordance with one embodiment of the presently claimed invention, a printed wiring board with a component connection pad providing thermal stress compensation for a surface mount circuit component includes: an electrically insulated printed wiring board substrate; and one or more electrically conductive wiring patterns printed on a surface of the substrate and including at least one pair of component connection pads for mounting a surface mount circuit component, wherein each one of the at least one pair of component connection pads comprises opposing first and second pluralities of conductive segments, each of which extend from respective distal ends toward respective opposing proximal ends, are mutually connected at the distal ends, and includes at least first and second surfaces, respectively, at the proximal ends for mounting respective contacts of a single surface mount circuit component.

In accordance with another embodiment of the presently claimed invention, a method for making a printed wiring board with a component connection pad providing thermal stress compensation for a surface mount circuit component includes: providing an electrically insulated printed wiring board substrate; and printing one or more electrically conductive wiring patterns on a surface of the substrate including at least one pair of component connection pads for mounting a surface mount circuit component, wherein each one of the at least one pair of component connection pads comprises opposing first and second pluralities of conductive segments, each of which extend from respective distal ends toward respective opposing proximal ends, are mutually connected at the distal ends, and includes at least first and second surfaces, respectively, at the proximal ends for mounting respective contacts of a single surface mount circuit component.

DETAILED DESCRIPTION

As discussed in more detail below a capacitor mounting technique is hereby introduced that uses a novel pad shape on standard PCBs, provides increased resilience to stress fractures in surface mount capacitors and other components, and continues to provide electrical connection even following sufficient mechanical stress such that the component becomes partially detached from the PCB.

Figure 1A:
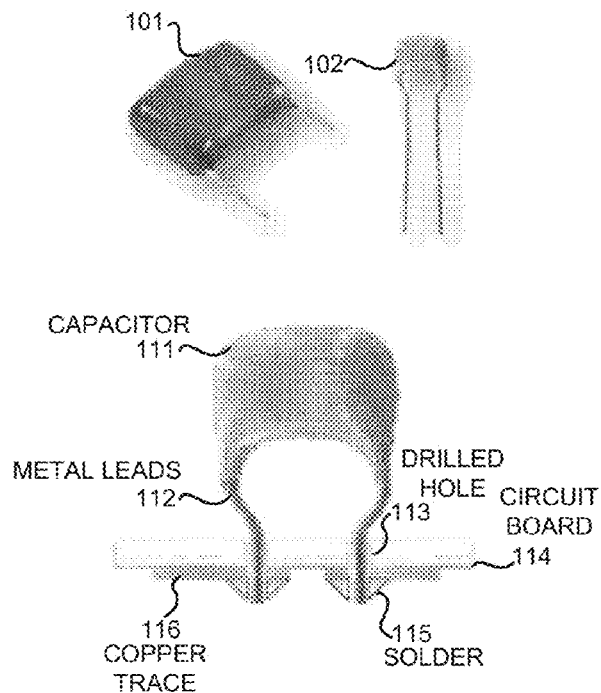
FIGS. 1(A) and 1(B) depict comparisons of conventional leaded and leadless component types and respective circuit board mounting techniques.
Figure 1B:
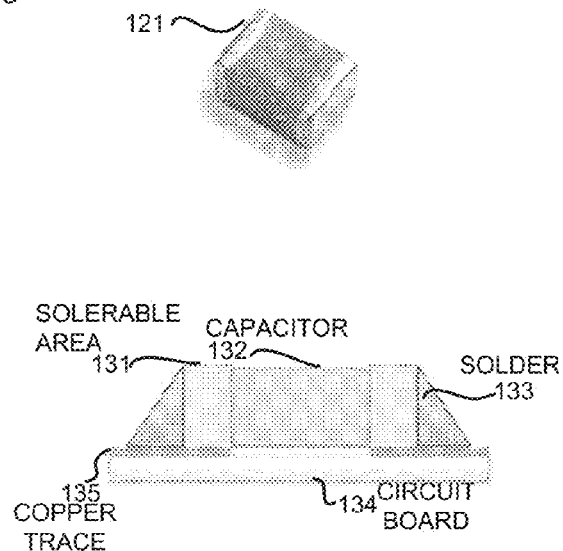
Figure 2A:
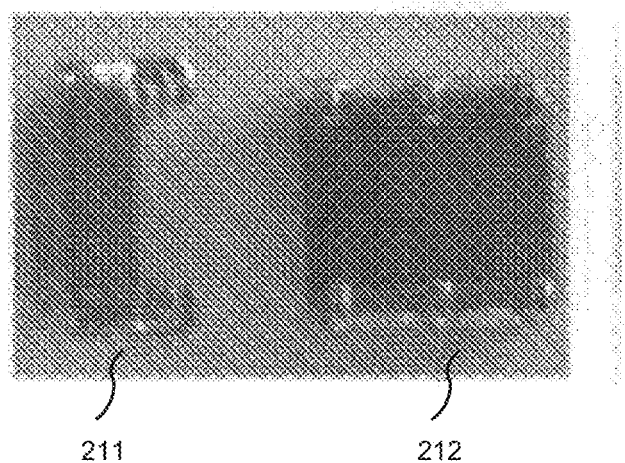
FIGS. 2(A), 2(B), 2(C) and 2(D) depict conventional capacitor designs enabling tolerance of mechanical stress.
Figure 2B:
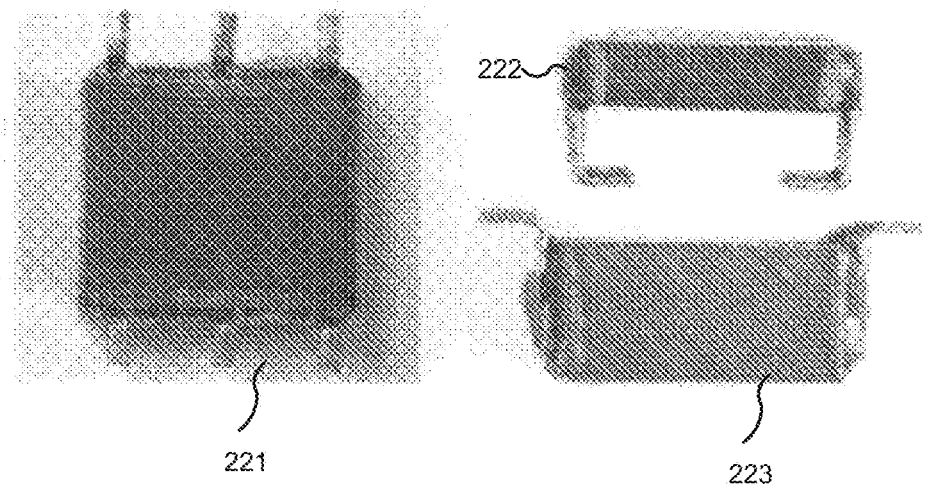
Figure 2C:
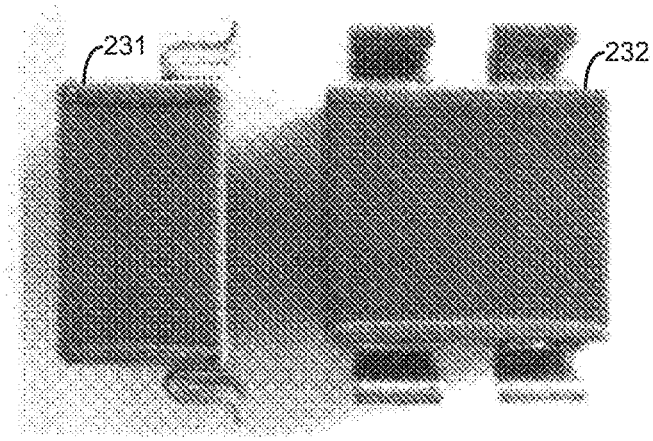
Figure 2D:
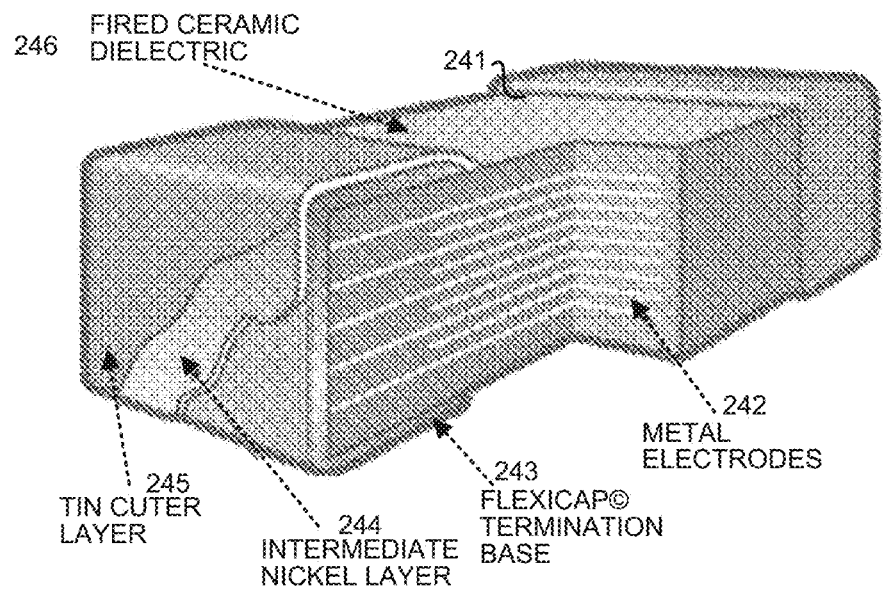
Figure 3:
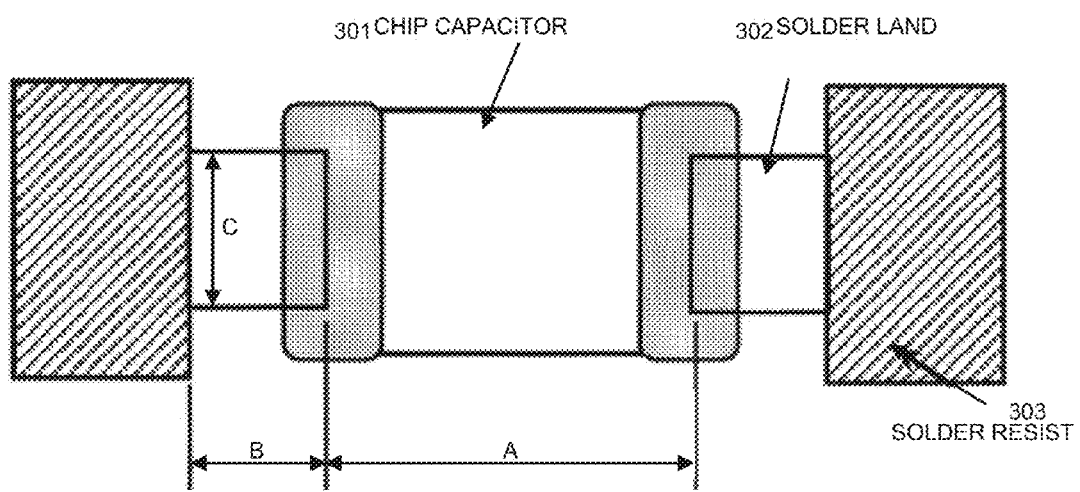
FIG. 3 depicts conventional restrictions on solder pad size.
Figure 4:
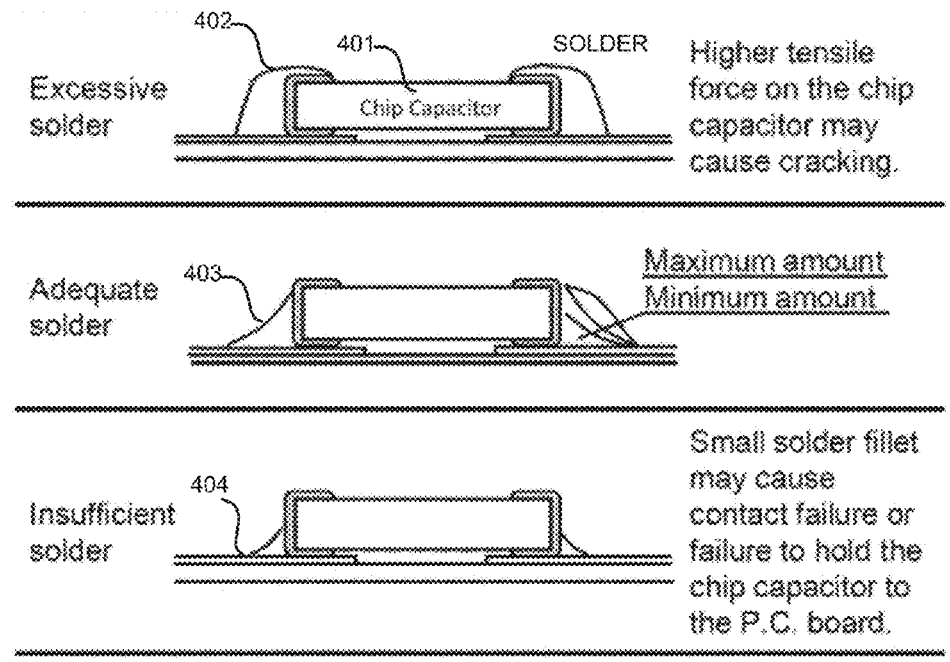
FIG. 4 depicts conventional recommended solder amounts.
Figure 5:
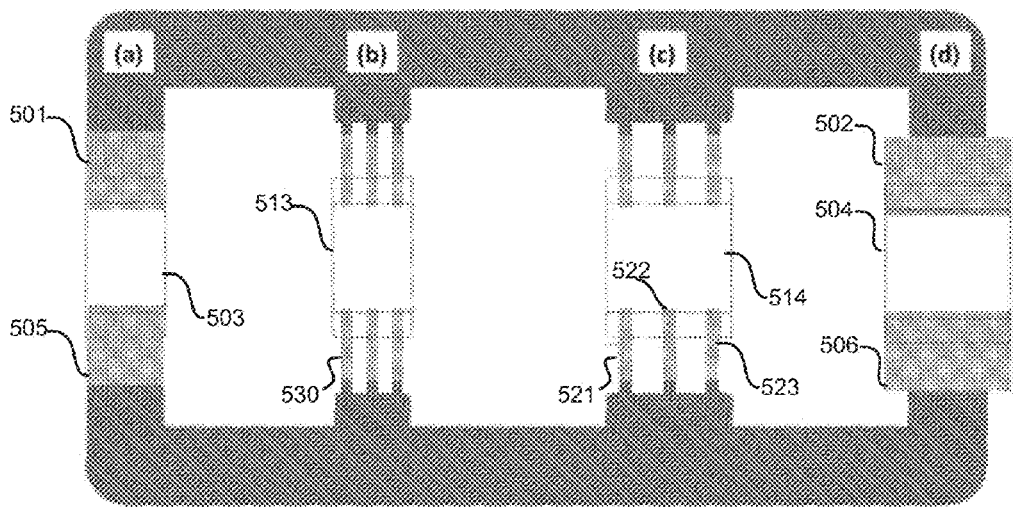
FIG. 5 depicts comparisons of conventional solder pad designs with solder pad designs in accordance with exemplary embodiments of the presently claimed invention.

The new invention is described for capacitors, but is equally applicable to other surface mount components. It uses a novel solder pad design, as shown in FIG. 5. In this test structure, conventional layouts are shown in (a), (d), for two component sizes (503, 504). As is common, the layouts use a single large solder pad at each end (501 & 505, 502 & 506). In contrast, layouts (b) and (c) use a new configuration for each component size (513, 514). The solder pad is divided into narrower fingers (521, 522, 523) at each end of the component. Two or more fingers may be employed, this example uses 3.

Figure 6:
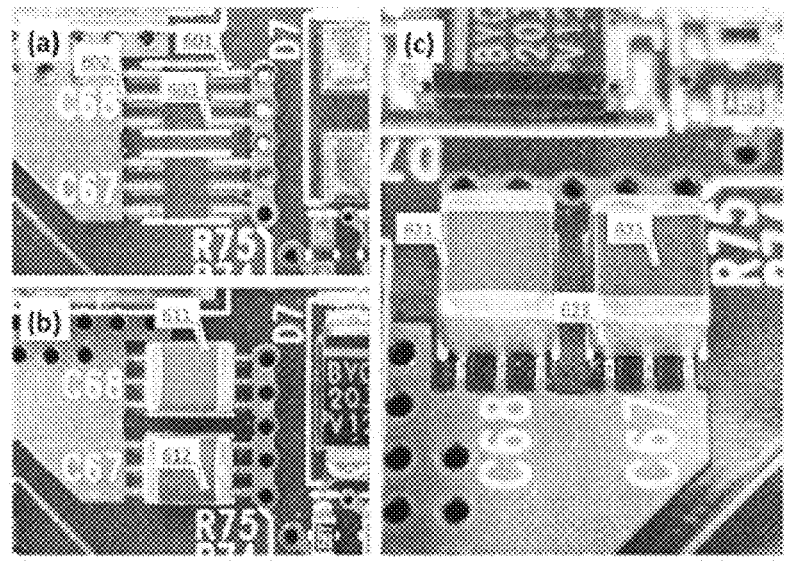
FIG. 6 depicts implementations of the solder pad designs in accordance with exemplary embodiments of the presently claimed invention.

FIG. 6 shows the new invention implemented on a circuit board with the fingers (601, 602, 603) shown on a bare board (a), with capacitors (611, 612) installed and soldered (b), and the same capacitors (621, 622) viewed from one end (c), so that the solder connection may be seen (example 623).

Figure 7:
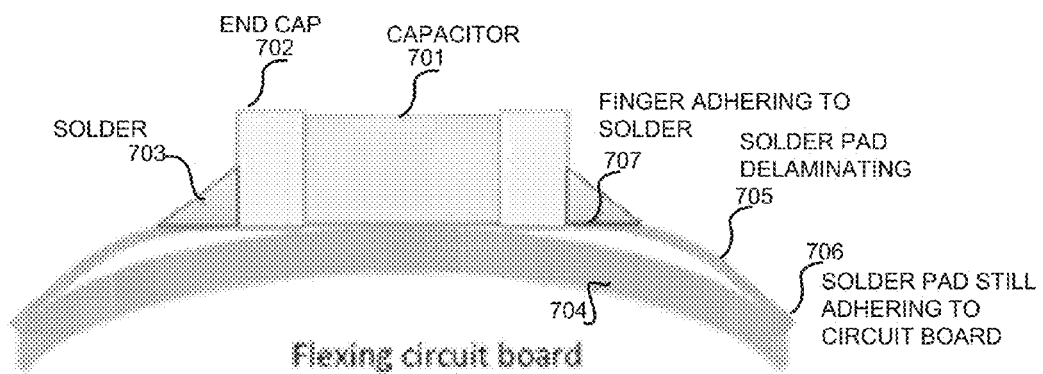
FIG. 7 depicts continued connection of solder pad designs in accordance with exemplary embodiments of the presently claimed invention notwithstanding extensive flexing of the circuit board.

Narrow fingers have less bond area to the PCB base material compared to conventional pad structures. These fingers should be narrow enough so that the amount of force that can be transferred to the capacitor is not sufficient to cause it to crack. When greater force is applied, one or more fingers will delaminate from the base material ((704), FIG. 7) but the electrical connection will remain unbroken (705) due to the stretchability of copper.

Accordingly, several advantageous are realized, including:
1. overall cost is not increased
2. standard PCB design and manufacturing techniques can be used
3. standard SMD soldering techniques can be used
4. regular components that are not designed specifically to be resilient to board flexing can be used
5. inductance is only slightly higher than conventional wide solder pads (502 for example)
6. more and smaller solder-attach areas place less tensile force on the component
7. finger detachment is compensated by redundancy with the additional fingers
8. higher resilience to board flexing
9. detachment of fingers on opposite corners of the component due to board twisting is compensated by the center fingers at a minimum remaining connected Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a printed wiring board with a solder pad providing thermal stress compensation for a surface mount circuit component, comprising:
   an electrically insulated printed wiring board substrate; and
   one or more electrically conductive wiring patterns printed on a surface of said substrate and including at least one pair of solder pads for soldering a surface mount circuit component, wherein each one of said at least one pair of solder pads comprises
   first and second conductive distal segments with
      opposing first and second lateral connection edges,
      first and second distal segment dimensions parallel with said first and second lateral connection edges, respectively,
      third and fourth distal segment dimensions perpendicular to said first and second lateral connection edges, respectively,
      first and second inductances, respectively, and
   opposing first and second pluralities of conductive connection segments, each of which
      is perpendicular to and extends from one of said first and second lateral connection edges toward one of opposing first and second proximal ends,
      is connected to one of said first and second lateral connection edges,
      has a connection segment width dimension substantially less than each of said first, second, third and fourth distal segment dimensions,
      has an inductance greater than said first and second inductances, and
      forms a portion of at least first and second surfaces at said first and second proximal ends, respectively, for soldering to respective contacts of a single surface mount circuit component.

2. The apparatus of claim 1, wherein:
   each of said first and second pluralities of conductive segments are mutually separated at said proximal ends; and
   said at least first and second surfaces at said proximal ends include first and second pluralities of surfaces, respectively.

3. The apparatus of claim 1, wherein each of said first and second pluralities of conductive segments comprises a plurality of conductive segments having equal segment widths and mutually separated by distances equal to or greater than said segment widths.

4. The apparatus of claim 1, wherein said first and second pluralities of conductive segments comprise first and second pluralities of mutually parallel conductors extending orthogonally to said respective contacts of a single surface mount circuit component.

5. A method for making a printed wiring board with a solder pad providing thermal stress compensation for a surface mount circuit component, comprising:
   providing an electrically insulated printed wiring board substrate; and
   printing one or more electrically conductive wiring patterns on a surface of said substrate including at least one pair of solder pads for soldering a surface mount circuit component, wherein each one of said at least one pair of solder pads comprises first and second conductive distal segments with
opposing first and second lateral connection edges,
first and second distal segment dimensions parallel
with said first and second lateral connection edges,
respectively,
third and fourth distal segment dimensions perpendicular to said first and second lateral connection edges, respectively,
first and second inductances, respectively, and
opposing first and second pluralities of conductive connection segments, each of which
is perpendicular to and extends from one of said first and second lateral connection edges toward one of opposing first and second proximal ends,
is connected to one of said first and second lateral connection edges,
has a connection segment width dimension substantially less than each of said first, second, third and fourth distal segment dimensions,
has an inductance greater than said first and second inductances, and forms a portion of at least first and second surfaces at said first and second proximal ends, respectively, for soldering to respective contacts of a single surface mount circuit component.

6. The apparatus of claim 5, wherein:
each of said first and second pluralities of conductive segments are mutually separated at said proximal ends; and
said at least first and second surfaces at said proximal ends include first and second pluralities of surfaces, respectively.

7. The apparatus of claim 5, wherein each of said first and second pluralities of conductive segments comprises a plurality of conductive segments having equal segment widths and mutually separated by distances equal to or greater than said segment widths.

8. The apparatus of claim 5, wherein said first and second pluralities of conductive segments comprise first and second pluralities of mutually parallel conductors extending orthogonally to said respective contacts of a single surface mount circuit component.

* * * * *